(12) United States Patent
Katoh et al.

(10) Patent No.: US 6,287,021 B1
(45) Date of Patent: Sep. 11, 2001

(54) APPARATUS FOR COUPLING ELECTRONIC COMPONENTS WITHIN ELECTRONIC DEVICES SUCH AS CAMERAS

(75) Inventors: Minoru Katoh, Kawasaki; Hidenori Miyamoto, Urayasu; Tadashi Otani, Otawara; Tomoki Nishimura, Kawasaki, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/314,509

(22) Filed: May 19, 1999

(30) Foreign Application Priority Data

May 20, 1998 (JP) .................................................. 10-138520
Nov. 10, 1998 (JP) .................................................. 10-318918

(51) Int. Cl.⁷ .................................................... G03B 17/04
(52) U.S. Cl. ............................ 396/348; 396/542; 439/67; 439/77; 174/254
(58) Field of Search .................................. 439/67, 69, 77; 174/254, 69; 396/155, 176–178, 205, 348, 349, 542

(56) References Cited

U.S. PATENT DOCUMENTS 4,864,348 * 9/1989 Fujiwara et al. ...................... 396/542
5,708,875 * 1/1998 Hayakawa ............................ 396/176
5,758,208 * 5/1998 Fuji et al. ............................. 396/542

* cited by examiner

Primary Examiner—David M. Gray
(74) Attorney, Agent, or Firm—Erik B. Cherdak & Associates, LLC.

(57) ABSTRACT

Apparatus such as a flexible printed circuit board (FPC) for coupling two electronic components that are configured to move relative to each other such as within a multi-part slide-open type camera, multi-part micro-scope, a scanner device, etc., that includes a first end configured to be coupled to a first electronic component, a flexible connecting member emanating from the first end, and a second end at which the connecting member terminates and which is used to connect the flexible connecting member to a second electronic component. The connecting member includes a component surface used to communicate electrical signals between the fist electronic component and the second electronic component. The flexible connecting member has a shape that permits it to extend and retract in directions substantially perpendicular to the component surface. The shape also permits the flexible connecting member to be maintained in a single plane when in a fully retracted state.

22 Claims, 16 Drawing Sheets

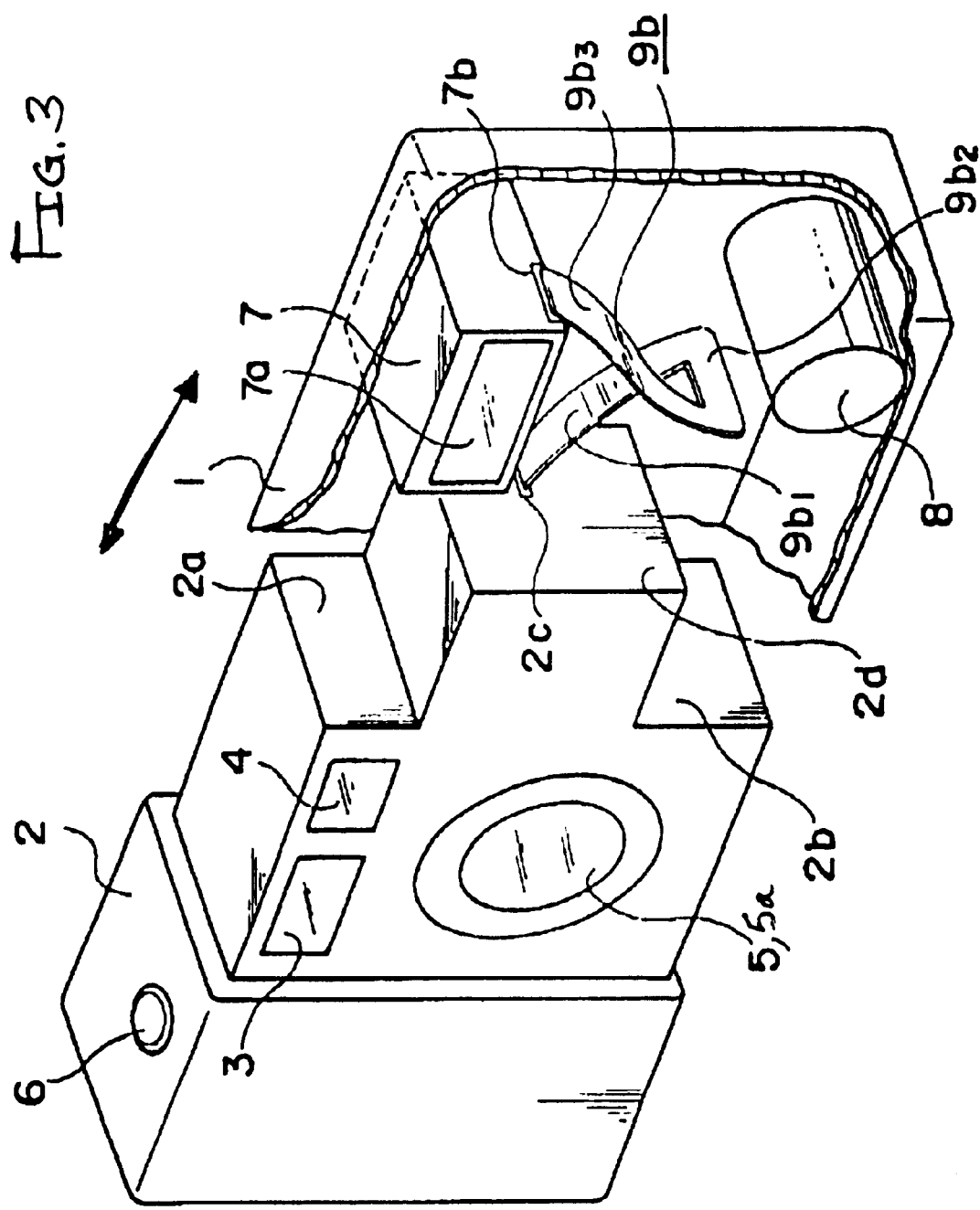

FIG. 10A
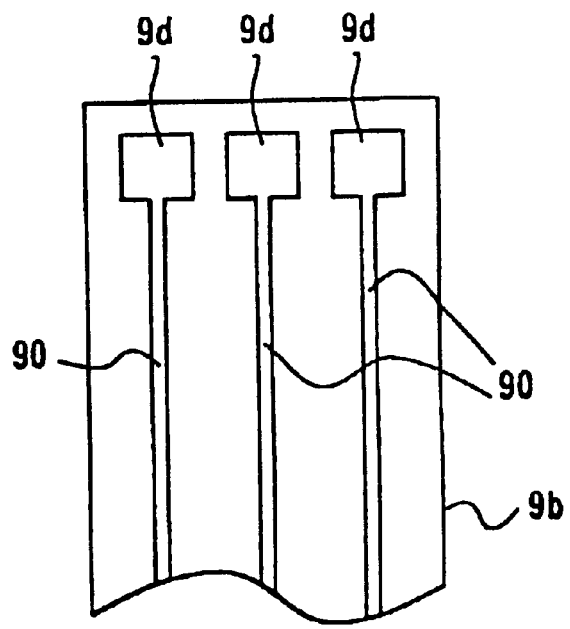
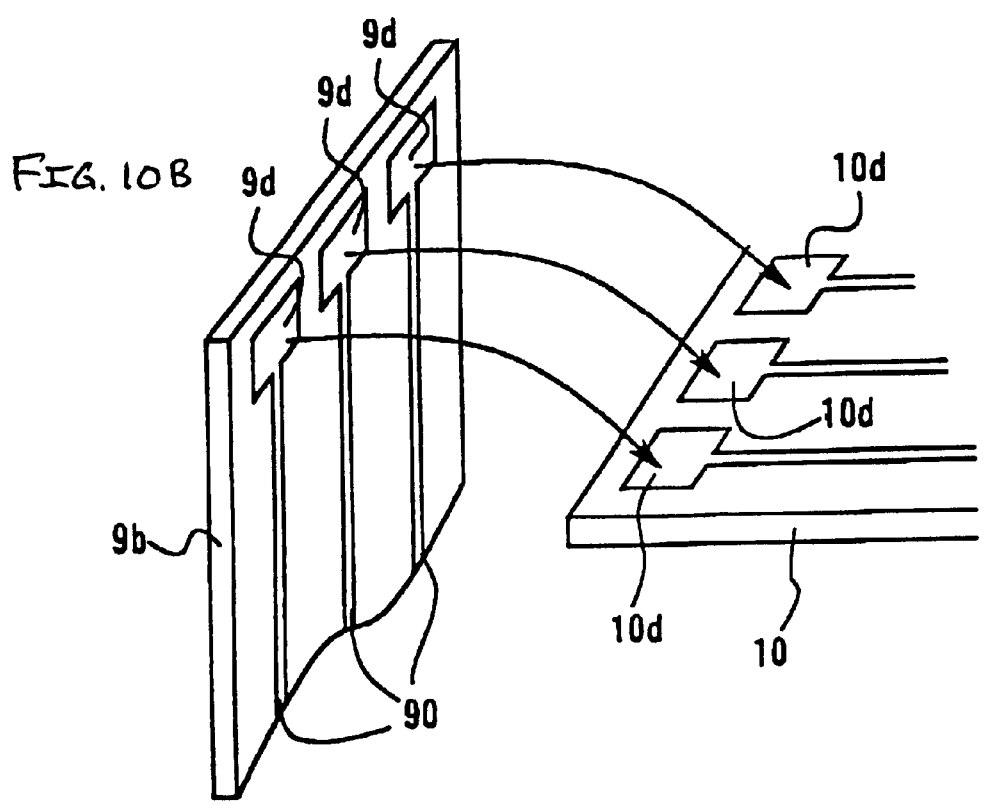
FIG. 10B

APPARATUS FOR COUPLING ELECTRONIC COMPONENTS WITHIN ELECTRONIC DEVICES SUCH AS CAMERAS

BACKGROUND OF THE INVENTION

1. Field of the Invention

The present invention relates to devices such as flexible printed circuit boards used to couple electronic components within electronic devices such as cameras and the like.

2. Description of the Related Art

Many electronic devices such as cameras, etc., incorporate components that move relative to each other. Often, such moveable components must be electrically coupled to each other to facilitate power and data transfers. To couple such components, flexible printed circuit boards or "FPCs" often are used. An electronic device that utilizes a conventional type FPC is shown in drawing figures identified as FIGS. 1A, 1B, 2A, and 2B which have been appended to this patent document.

FIGS. 1A and 1B are diagrams of a camera. More particularly, FIG. 1A shows a state in which a lens barrel 100 and photographic lens 105 are collapsed within a camera body 101. FIG. 1B shows a state in which lens barrel 100 protrudes from camera body 101. A circuit unit 102 used in performing focusing or shutter driving operations is disposed in lens barrel 100. Circuit unit 102 is connected to a main device board (not shown in the drawing) disposed in camera body 101 at camera body point 104 via an FPC 103. A connecting portion 102a of circuit unit 102 is used to connect to FPC 103. Another connecting member 104a is maintained on the camera body side to connect to FPC 103.

With reference to FIGS. 2A and 2B, depicted therein are diagrams of FPC 103 as originally shown in FIGS. 1A and 1B, respectively. FIG. 2A is a diagram that shows FPC 103 when lens barrel 100 is in a retracted or closed position. As shown, a gap Lo exists between circuit member 102 and camera body point 104 such that FPC 103 is maintained in a folded-up state. The fold or bend in FPC 103 occurs as a result of movement of lens barrel 100. As shown in FIG. 2B, when lens barrel 100 is extended, FPC 103 is unfolded and gap Lo is widened.

Although FPC 103 permits electrical connection within camera 100, stresses resulting from movement of FPC 103 concentrate in portion 103a. As a result, surface malformations and dis-connections often occurred as a result of repeated lens barrel movement. Such problems were exacerbated by the fact that the smaller the bending radius of portion 103a as shown in FIG. 2A, the larger the change of the angle θ as shown in FIG. 2B. And, unfortunately, it was disadvantageous to make the folding space larger as internal spaces within camera body 101 needed to be correspondingly enlarged.

Thus, there exists a need to provide new and improved connecting devices such as FPCs that minimize and negate the effects of repeated movement and the like. Additionally, to be viable such connecting devices must be effective within small spaces such as those found within cameras and other compact electronic devices.

SUMMARY OF THE INVENTION

Accordingly, the present invention has as its principal object to solve the problems mentioned above. In so doing, the present invention provides a new flexible connecting apparatus that allows at least two electronic components to be connected to each other reliably and in situations where repeated movement of the two electronic devices is realized. As a result, the present invention provides certain benefits not heretofore realized by prior devices and, in particular, prior flexible printed circuit board components. For example, the present invention now provides device manufactures with a component that may be placed into small, tight spaces that can be reliably used to facilitate electrical and data connections among electronic components. By utilizing certain geometric shapes and patterns, a new flexible printed circuit board (FPC) is realized that better responds to destructive stresses from component movement and takes up less space inside of complex electronic devices such as cameras, microscopes, projection scanner equipment, etc.

The present invention solves the aforementioned problems to deliver the above-described benefits by providing an apparatus such as a flexible printed circuit board (FPC) for coupling two electronic components that are configured to move relative to each other such as within a multi-part, slide-open type camera, multi-part micro-scope, a scanner device, etc. that includes a first end configured to be coupled to a first electronic component, a flexible connecting member emanating from the first end, and a second end at which the connecting member terminates and which is used to connect the flexible connecting member to a second electronic component. The connecting member includes a component surface used to communicate electrical signals between the fist electronic component and the second electronic component. The flexible connecting member has a shape that permits it to extend and retract in directions substantially perpendicular to the component surface. The shape also permits the flexible connecting member to be maintained in a single plane when in a fully retracted state.

BRIEF DESCRIPTION OF THE DRAWING FIGURES

The present invention is described below with reference to the following drawing figures, of which:

FIG. 3 is a perspective view of a slide-open type camera that includes an apparatus for coupling electronic components provided in accordance with a preferred embodiment of the present invention;

FIGS. 10A and 10B are diagrams of an exemplary mounting region of a printed circuit board that is configured to connect with an apparatus for coupling electronic components provided in accordance with a preferred embodiment of the present invention;

Figure 11A:
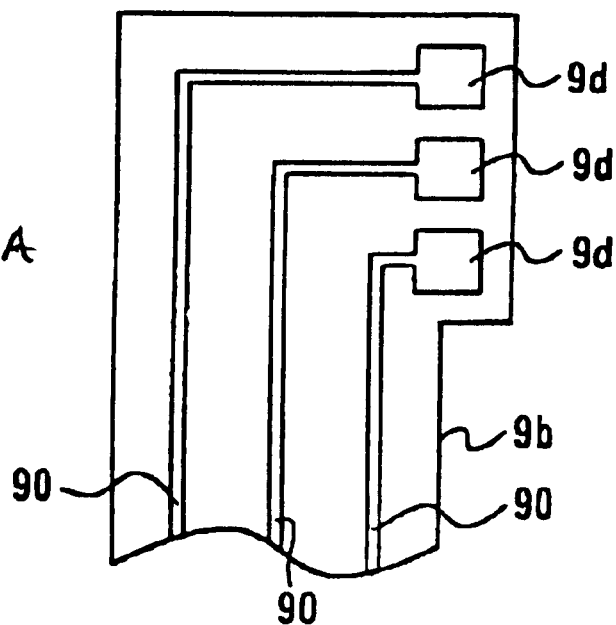
Figure 11B:
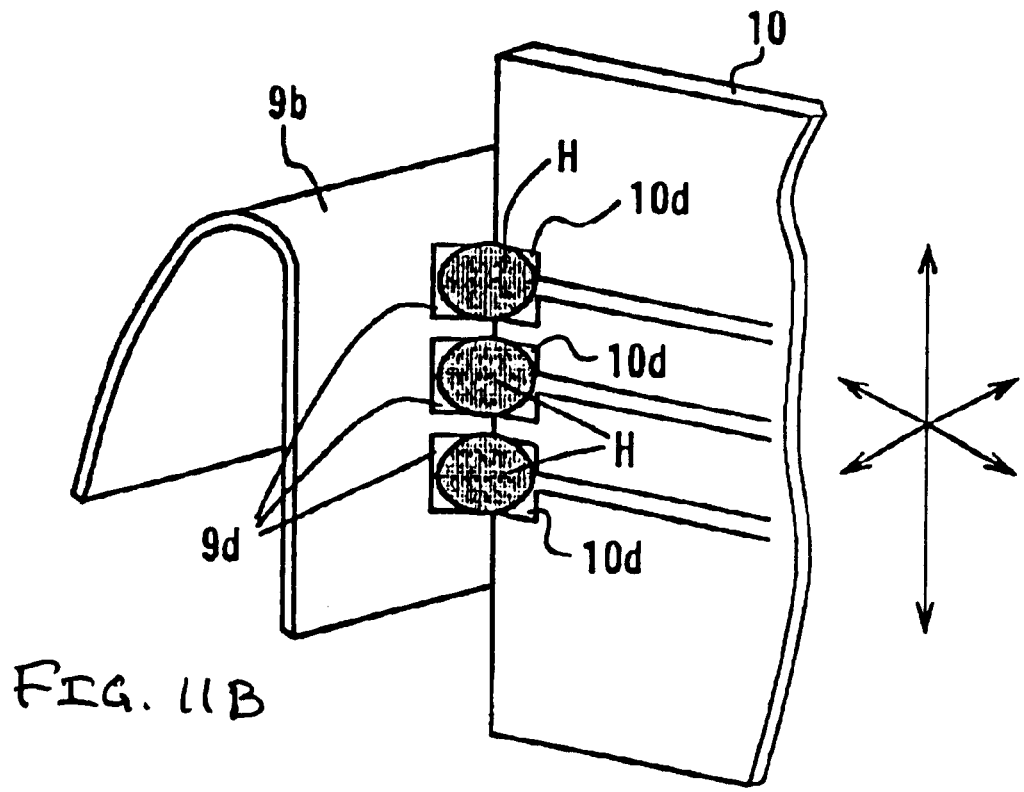
Figure 12A:
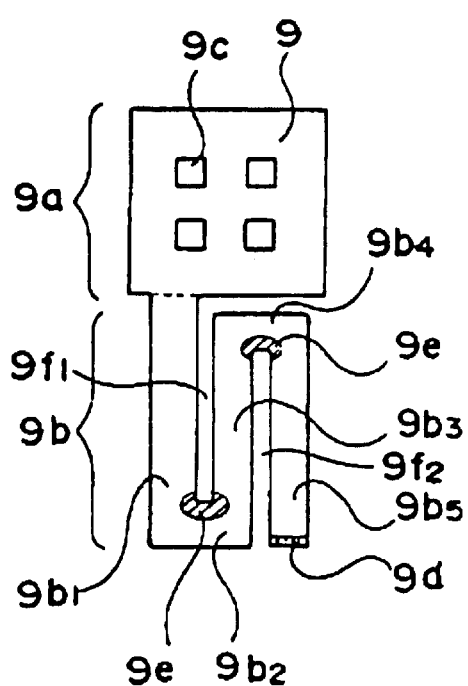
Figure 12B:
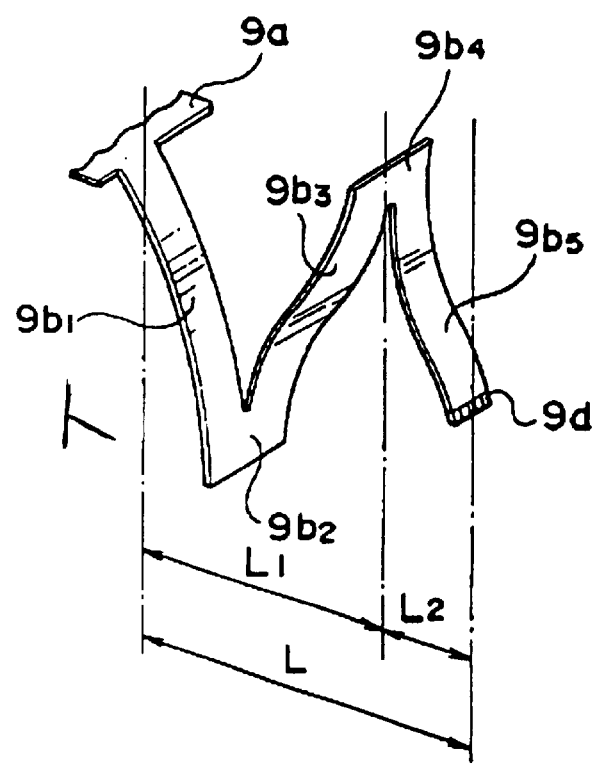
Figure 13A:
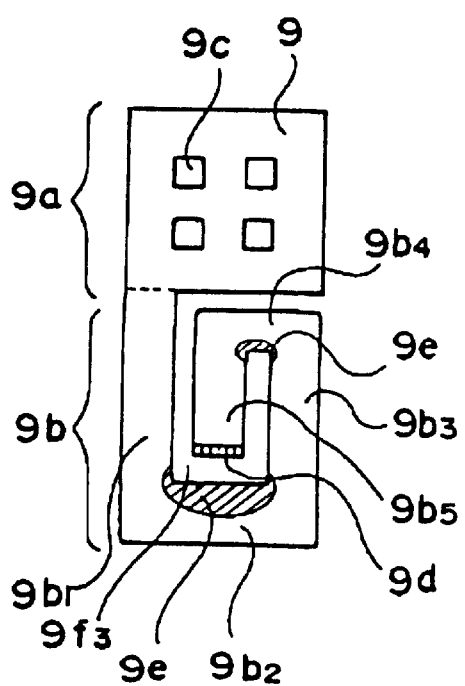
Figure 13B:
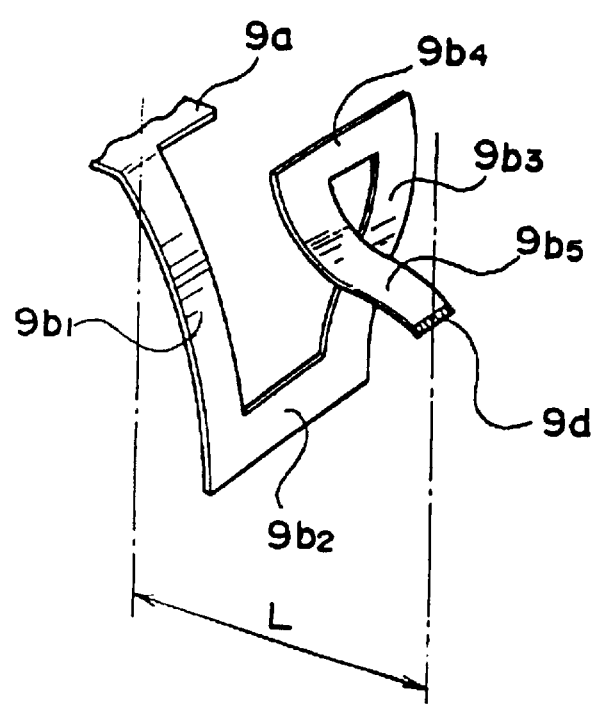
Figure 14A:
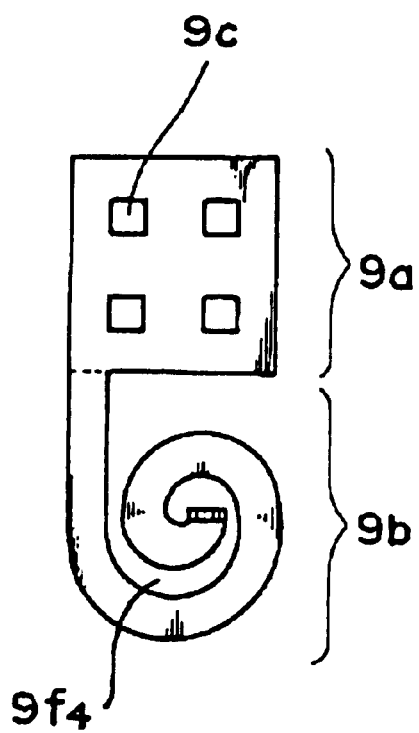
Figure 14B:
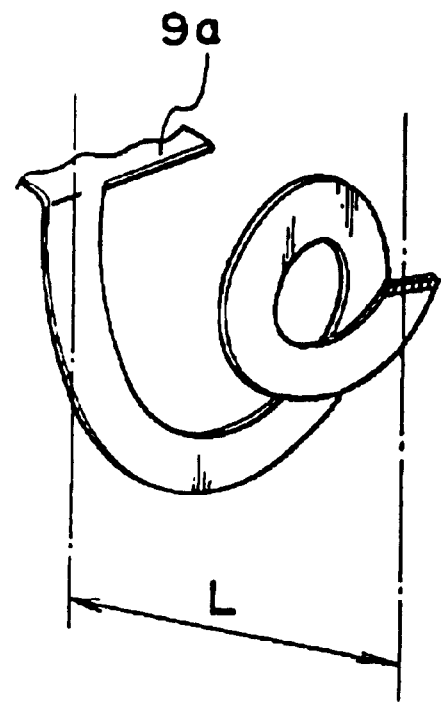
Figure 15:
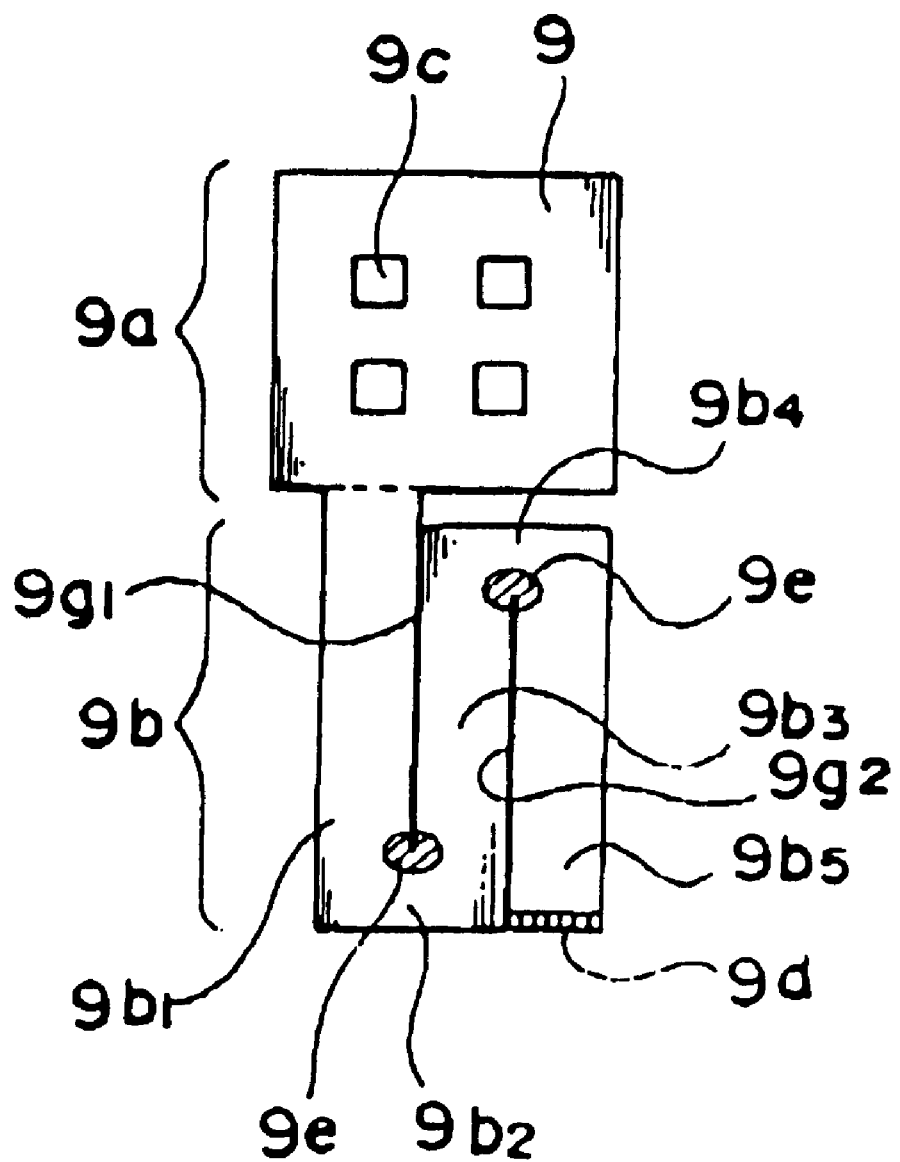
Figure 16:
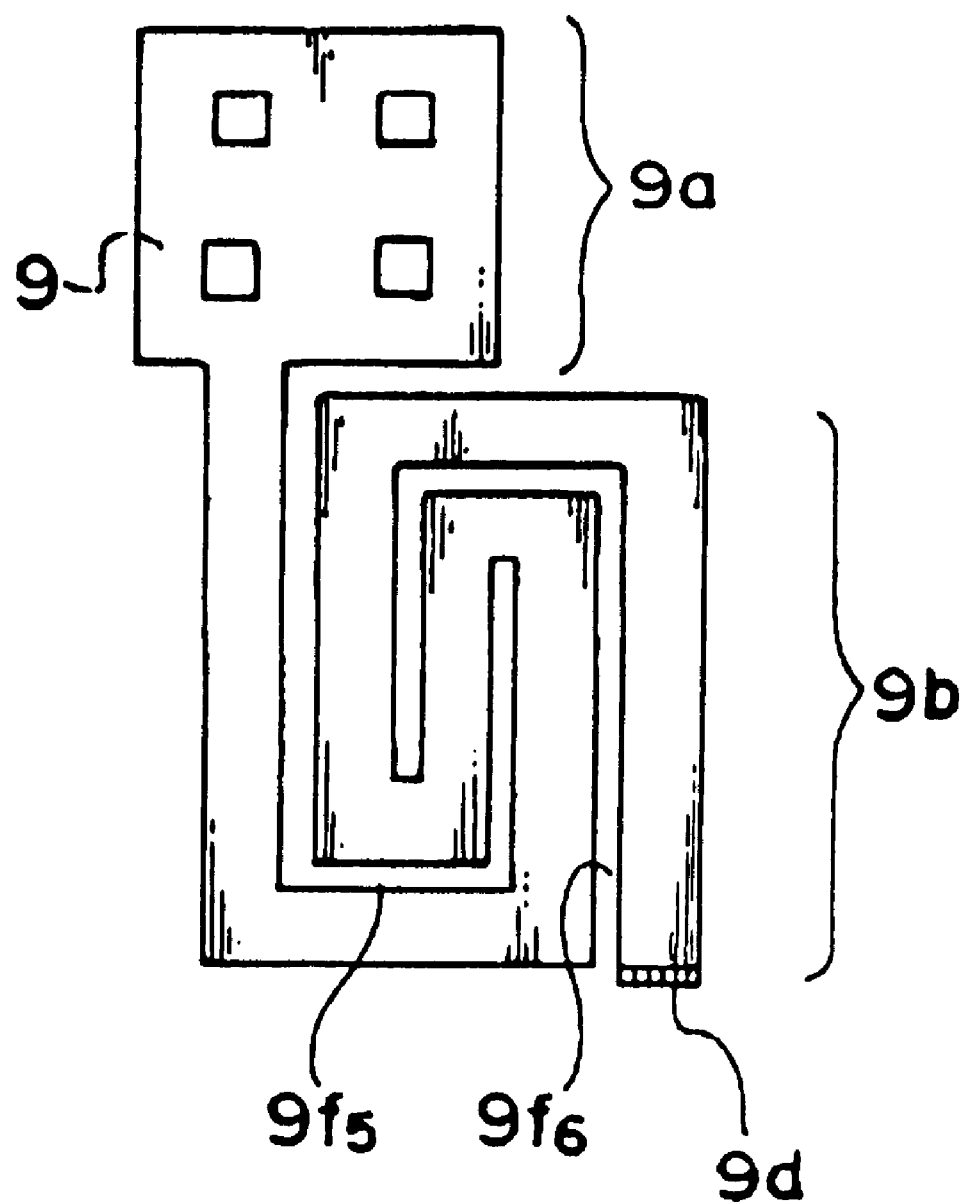

FIGS. 11A and 11B are diagrams of another exemplary mounting region of a printed circuit board that is configured to connect with an apparatus for coupling electronic components provided in accordance with a preferred embodiment of the present invention FIGS. 12A and 12B are diagrams of a strobe unit mounting board that is provided in accordance with another preferred embodiment of the present invention;

FIGS. 13A and 13B are diagrams of a strobe unit mounting board that is provided in accordance with another preferred embodiment of the present invention;

FIGS. 14A and 14B are diagrams of a strobe unit mounting board that is provided in accordance with a preferred embodiment of the present invention;

FIG. 15 is a diagram of a strobe unit mounting board that is provided in accordance with another preferred embodiment of the present invention; and FIG. 16 is a diagram of strobe unit mounting board that is provided in accordance with another preferred embodiment of the present invention.

DETAILED DESCRIPTION OF THE PREFERRED EMBODIMENTS

The present invention is now discussed with reference to the drawing figures that were briefly described above. A discussion of each preferred embodiment of the present invention is followed by a corresponding discussion of its operation. Unless otherwise specified, like parts are referred to with like reference numerals.

Each of the preferred embodiments discussed below has been applied to a camera type electronic device. The present invention, however, is not so limited. To the contrary, the present invention may be applied to other electronic devices especially those that include tight or small internal spaces where movement of components is repeatedly carried out. For example, it is possible to apply the present invention to a microscope having an X-Y stage which is movable relative to a microscope body, and to a scanner equipped with a stage which moves relative to a body, etc.

Figure 4:
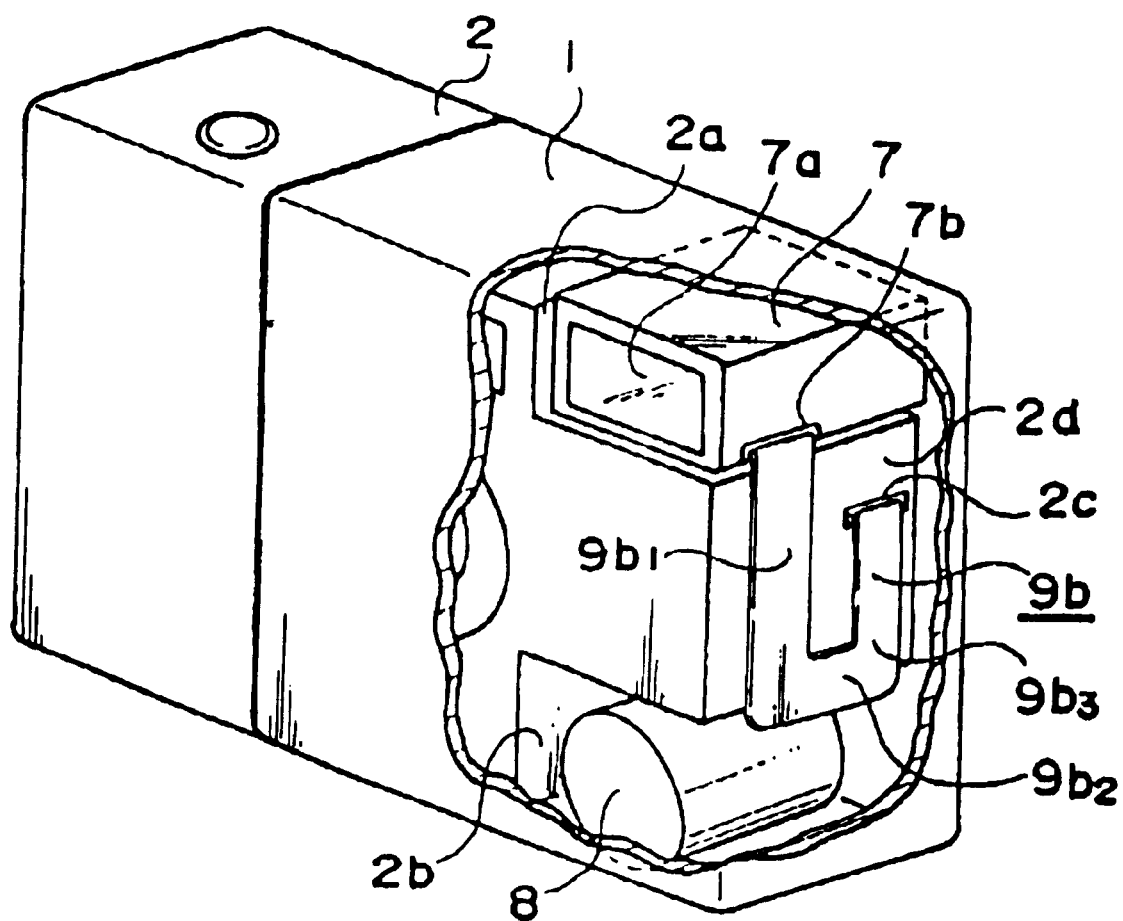
FIG. 4 is a perspective view of the camera depicted in FIG. 3 in a closed state.
Figure 5:
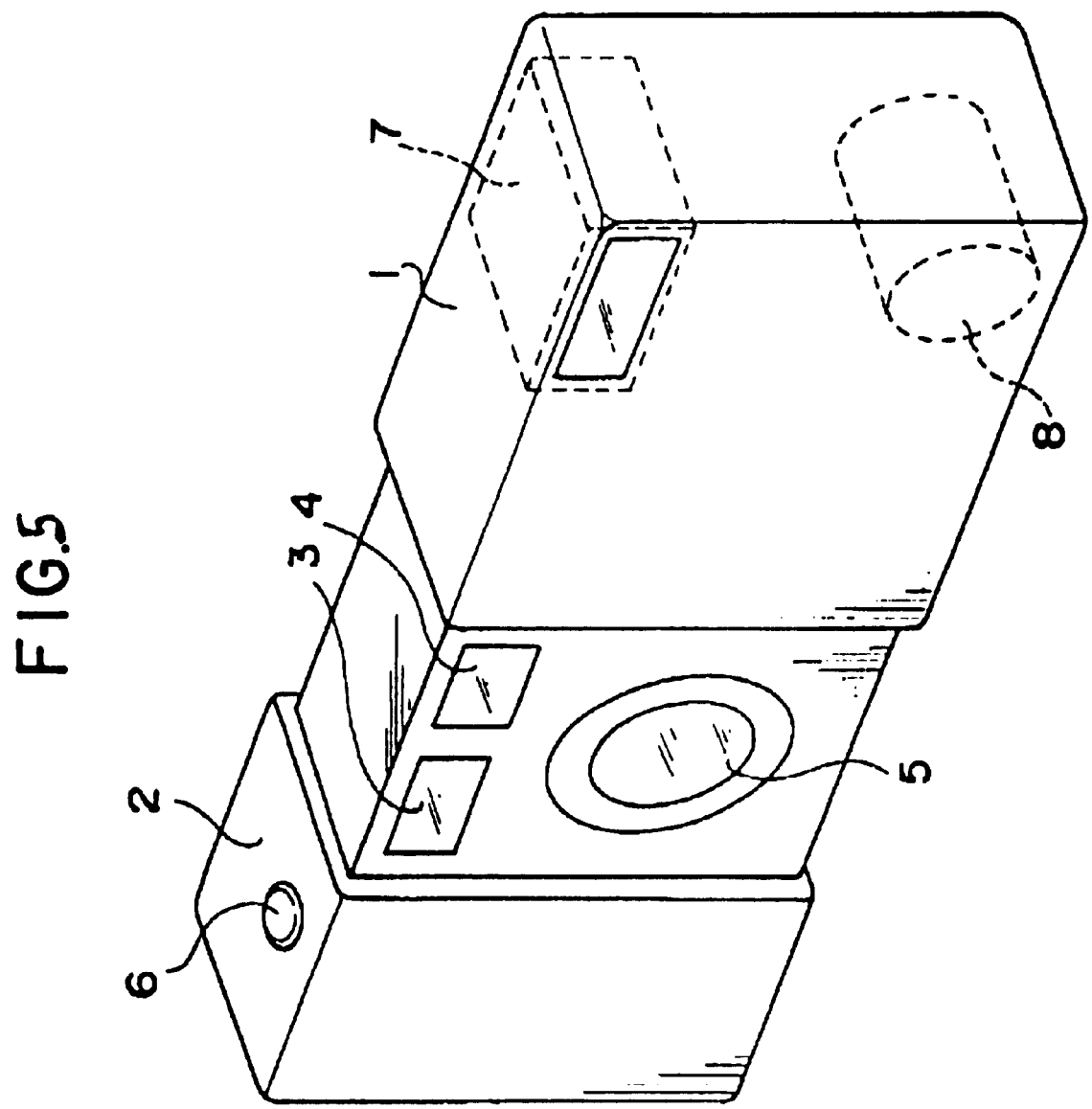
FIG. 5 is another perspective view of the camera depicted in FIG. 3.
Figure 6:
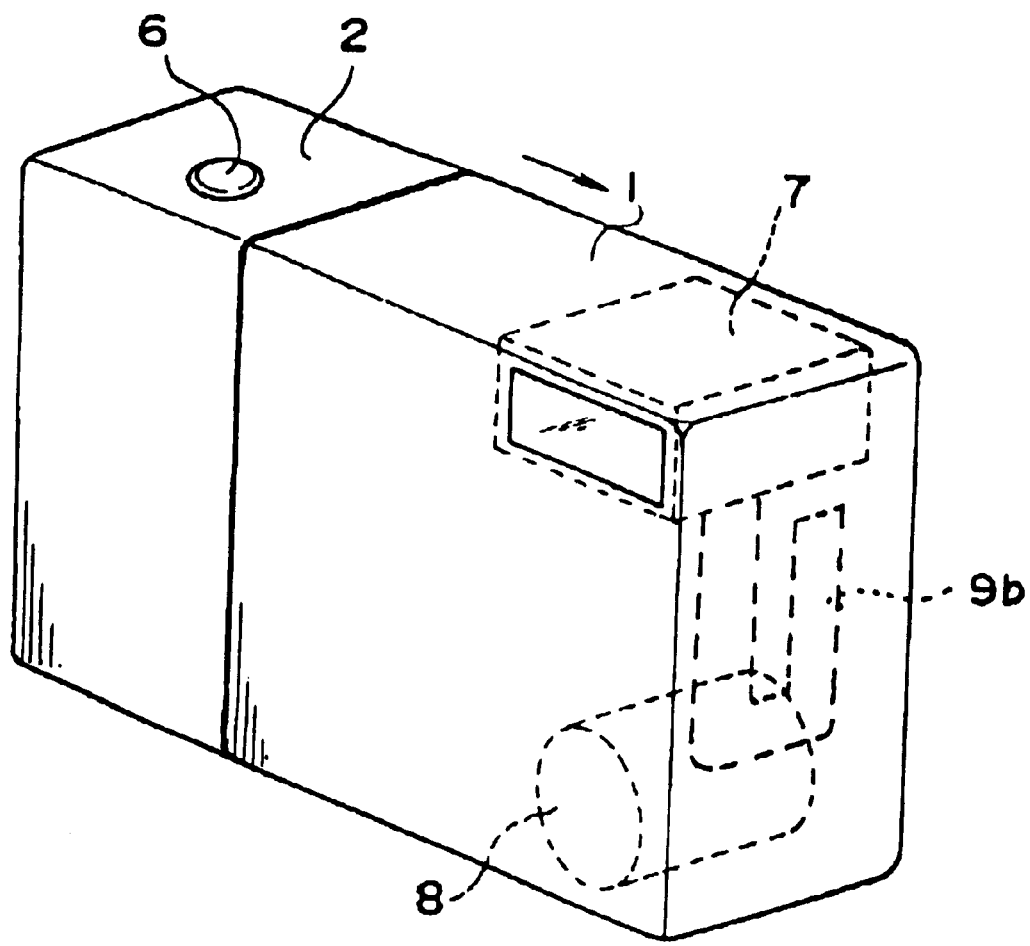
FIG. 6 is another perspective view of the camera depicted in FIG. 3 after a slide cover has been closed.

With reference to FIGS. 3–6, the same depict a slide-open type camera that includes an apparatus for coupling electronic components therein in accordance with a preferred embodiment of the present invention. In particular, FIGS. 3 and 4 are perspective views of the interior of the camera, and FIGS. 5 and 6 are perspective views of the exterior of the camera. FIG. 4 shows the state in which a slide cover 1 of the camera is closed. When slide cover 1 is moved in a direction corresponding to the double-headed arrow in FIG. 3, photographic or other type imaging operations are possible. When such operations are possible, a viewfinder objective window 4, AF window 3, and a lens barrel 5 equipped with the photographic lens 5a, are exposed. Accordingly, photography/imaging may be performed by pressing a release button 6.

As shown in FIGS. 4 and 6, when slide cover 1 is closed, viewfinder objective window 4, AF window 3, and lens barrel 5 are housed within slide cover 1, and release button 6 is locked thus preventing photographic/imaging operations. A strobe unit 7 and strobe main capacitor 8 are disposed within slide cover 1. Strobe unit 7 and strobe main capacitor 8 are fixed within slide cover 1, and move when slide cover 1 moves.

Figure 7:
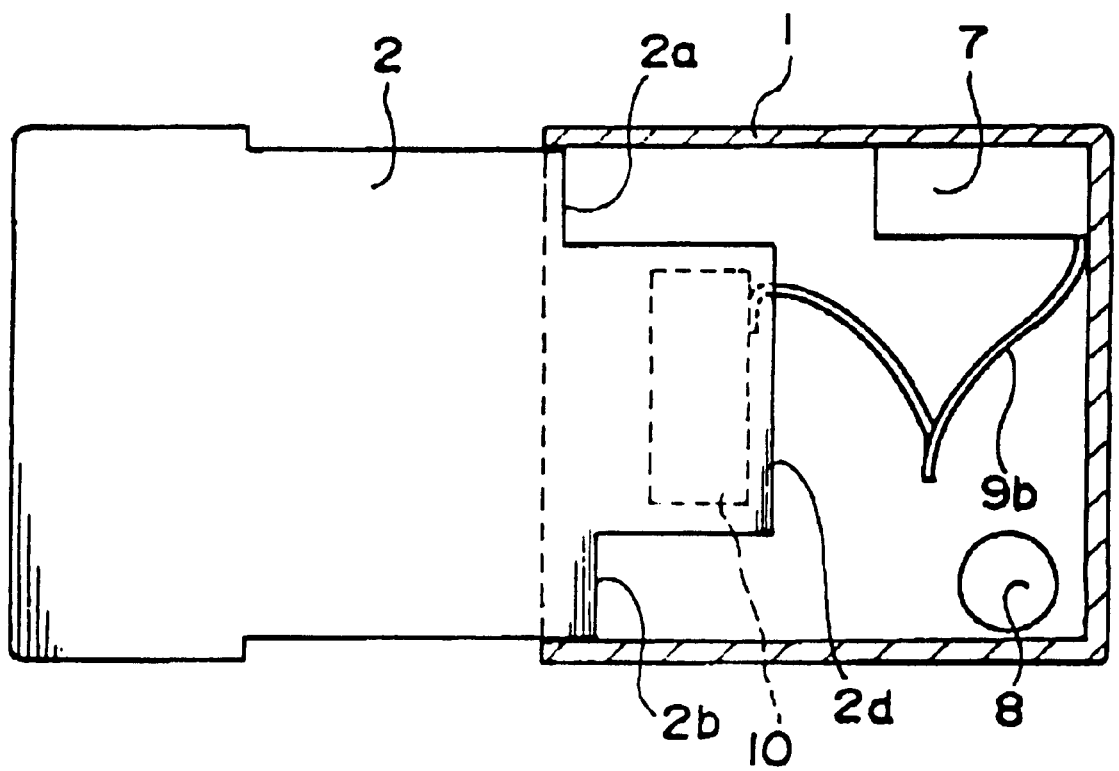
FIG. 7 is a cross-section diagram of the camera shown in FIG. 5.
Figure 8:
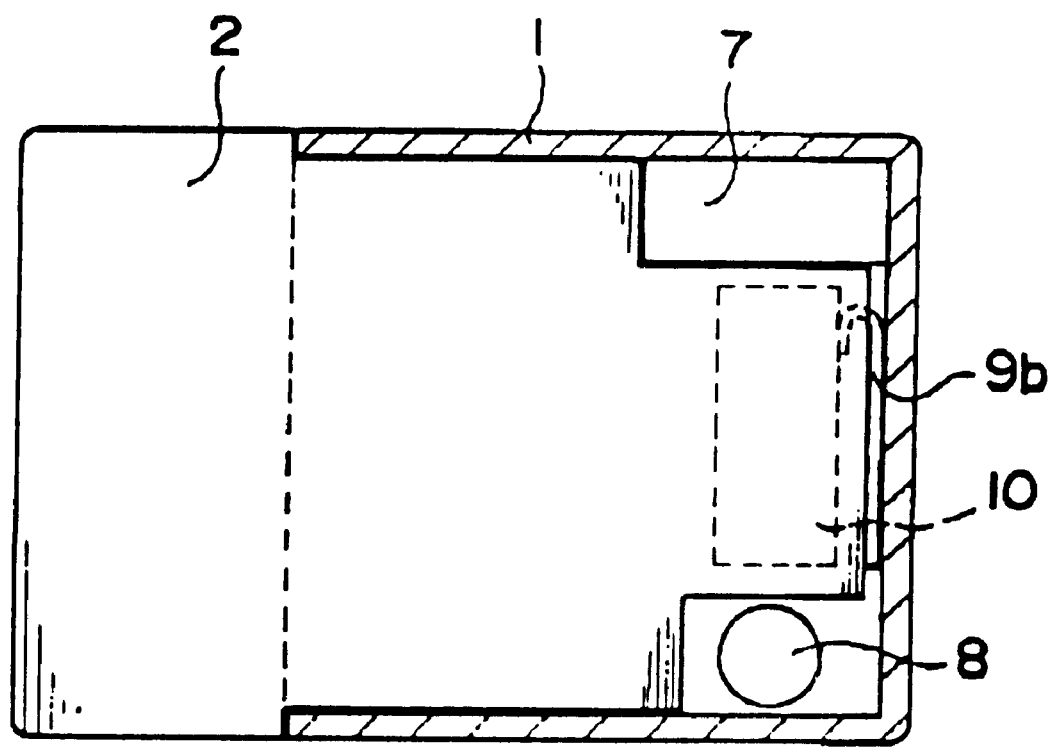
FIG. 8 is a cross-section diagram of the of the camera shown in FIG. 6.

Referring now to FIGS. 7 and 8, depicted therein are cross-section diagrams of the camera shown in FIGS. 3–6 as seen from a front side thereof and in open and closed states, respectively. FIG. 7 corresponds to the state shown in FIG. 5, and FIG. 8 corresponds to the state shown in FIG. 6. Strobe unit 7 is mounted in an upper corner portion of slide cover 1 and includes a light emission window. Strobe main capacitor 8 is mounted in a lower corner portion of slide cover 1. Strobe unit 7 and strobe main capacitor are connected to each other via lead wires (not shown). Notch portions 2a and 2b are formed in slide cover 1 to permit placement of strobe unit 7 and strobe main capacitor 8 when the slide cover 1 is closed. That is, strobe unit 7 is fitted into the notch portion 2a and strobe main capacitor 8 is fitted into the notch portion 2b when slide cover 1 is closed.

Referring again to FIG. 3, strobe unit 7 is connected to control circuitry within camera body 2 via an FPC 9b which has been provided in accordance with the present invention. FPC 9b is connected, for example, to strobe unit 7 via an aperture 7b thereof and to control circuitry within camera body 2 via an aperture 2c thereof. In particular, FPC 9b is connected through aperture 2c to a main mounting/printed circuit board 10 (see FIGS. 7 and 8 at phantom lines). As shown in FIG. 8 when slide cover 1 is closed, FPC 9b is in a retracted and, possibly, a fully retracted state. When in such a fully retracted state, FPC 9b may be said to be maintained within a single plane.

Figure 9A:
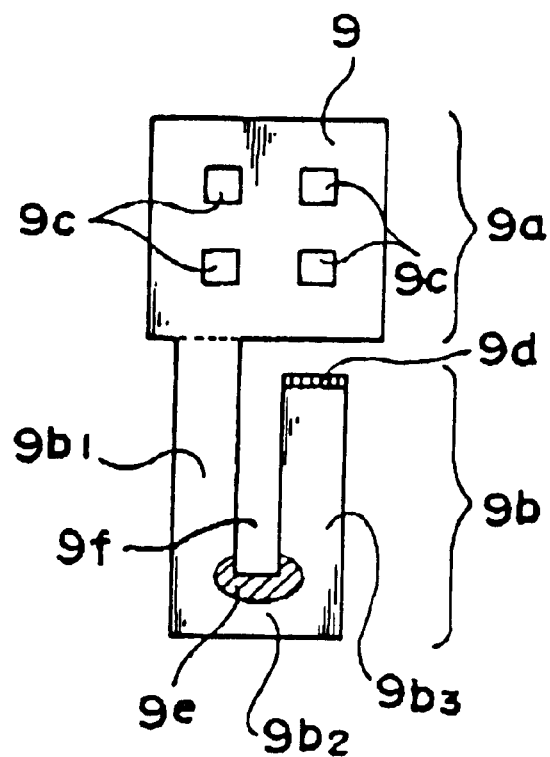
FIGS. 9A and 9B are diagrams of a strobe unit mounting board that provided in accordance with a preferred embodiment of the present invention.

Referring now to FIG. 9A, depicted therein is a diagram of a strobe mounting board 9 used in conjunction with strobe unit 7. Strobe mounting board 9 includes a strobe mounting unit 9a and an FPC portion 9b provided in accordance with a preferred embodiment of the present invention. Strobe mounting portion 9a includes plural mounting components 9c, and is fixed within the strobe unit 7. FPC 9b is used to connect the strobe mounting unit 9a within the strobe unit 7 and the main mounting board 10 (see FIGS. 7 and 8) which is disposed in the interior of camera body 2. A land portion 9d is disposed at an end section of FPC 9b in order to connect the main mounting board 10 via a solder bridge, for example.

Figure 1A:
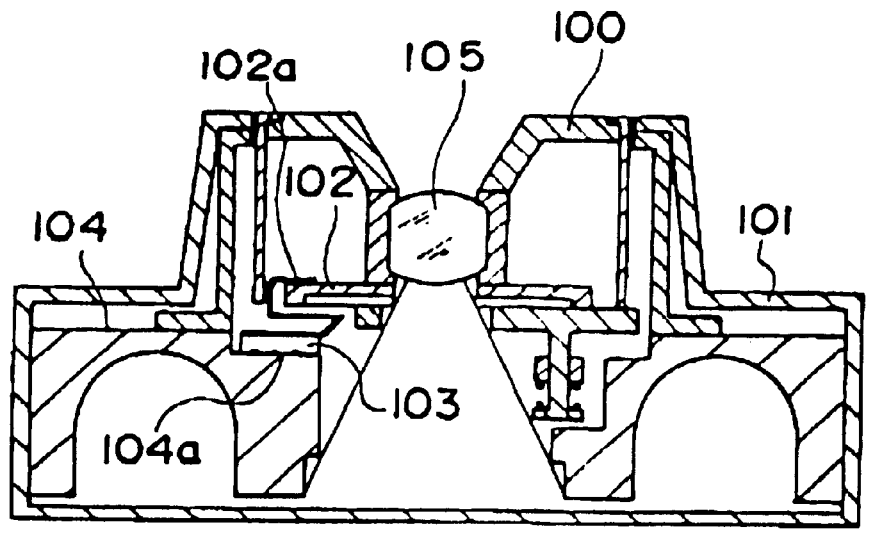
FIGS. 1A and 1B are cross-section diagrams of a camera in both closed and open states, respectively, and which includes a flexible printed circuit board (FPC) to couple electronic components within the camera according to the prior art.
Figure 1B:
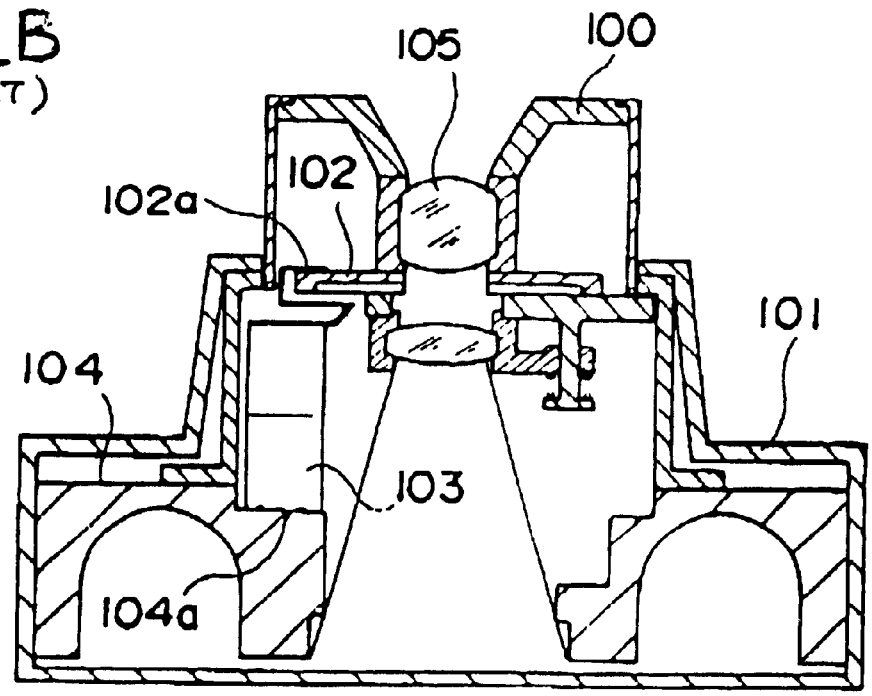
Figure 9B:
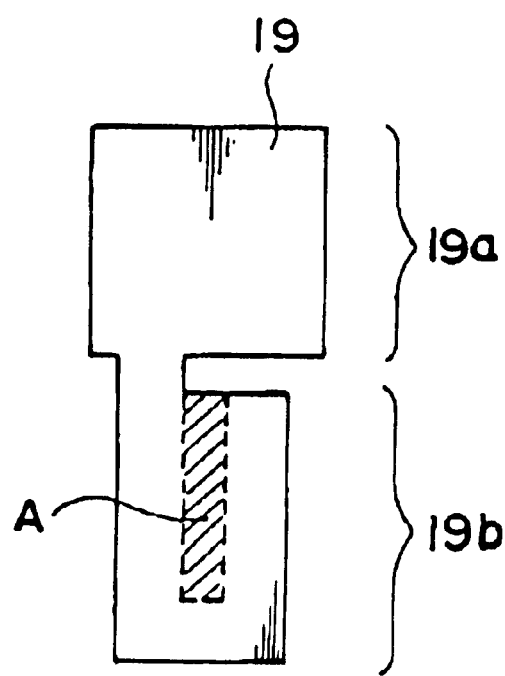

FPC 9b, as shown in FIG. 9B, has an obliquely shaded portion cut out of the connection portion region 19b. As a result, as shown in FIG. 9B, straight portions 9b1 and 9b3 terminate at a bending portion 9b2. In between straight portions 9b1 and 9b3 is cut-away portion 9f. In a closed camera state as shown in FIG. 4, for example, straight portions 9b1, 9b3 of FPC 9b and bending portion 9b2 are retracted to rest in about or in the same plane, and FPC 9b is housed in the gap between the end surface 2d of camera body 2 and the inner surface of the slide cover 1. On the other hand, in an opened state as shown in FIG. 1, for example, straight portion 9b3 of FPC 9b is pulled and extended toward camera body 1 while bending portion 9b2 respectively deforms and extends toward strobe unit 7 and straight portion 9b1 extends toward camera body 2. Accordingly, stresses are concentrated at stress concentration portion 9e (FIG. 9A) as a result of a twisting action instead of a folding action that causes stress to actual printed circuit board elements/traces on FPC 9b.

Figure 2A:
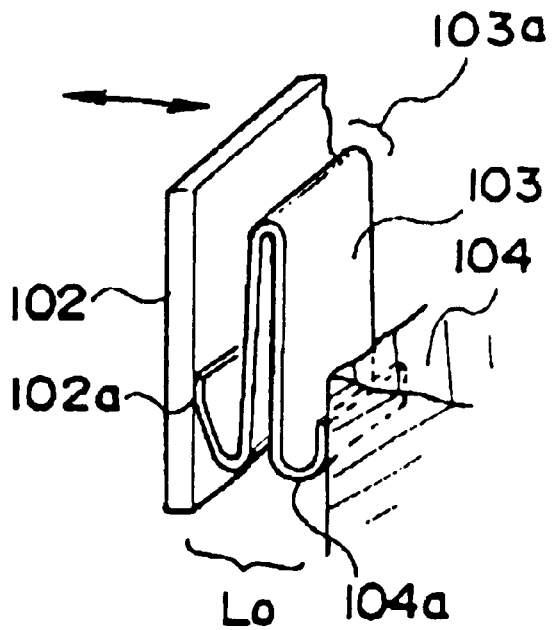
FIGS. 2A and 2B are diagrams of the FPC originally shown in FIGS. 1A and 2B, respectively.
Figure 2B:
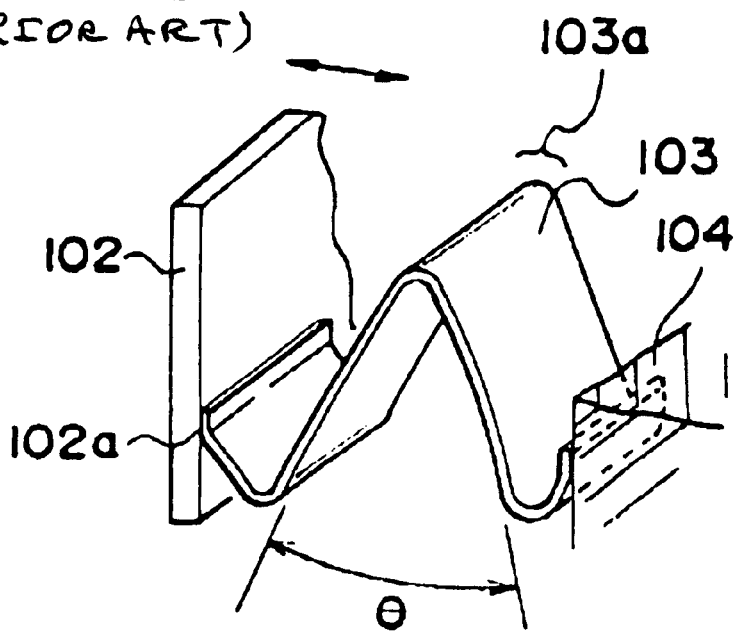

In comparison to the structures shown in FIGS. 2A and 2B as described above, for example, bending portion 9b2 is deformed by twisting. As a result, even if slide cover 1 is opened and closed a relatively large number of times, risk of breaks and the like due to stress and the like are minimized. As such, durability of FPC 9b can be increased. Moreover, as straight portions 9b1 and 9b3 are in about or in the same plane when slide cover 1 is in a closed state, the thickness of FPC 9b can be kept small to about the gap dimension between the end face 2d of camera body 2 and the inner surface of slide cover 1; that is, the space needed to support or otherwise suspend FPC 9b is kept to a minimum.

Referring now to FIGS. 10A and 10B, depicted therein are enlarged diagrams of land portions 9d of FPC 9b. Traces 90 are disposed on FPC 9b. The arrangement of lands 9d as in FIG. 10A is used in the case that, as shown in FIG. 10B, the main mounting board 10 is located horizontally (perpendicular with respect to a lengthwise direction on FPC 9b). Lands 10d are lands on printed board 10 which are configured to make contact with lands 9d. Because printed circuit board 10 of the camera is generally arranged perpendicularly (see FIG. 11B), lands 9d are located along a lengthwise direction of FPC 9b, as shown in FIG. 11A. As shown in FIG. 11B, a connection of the printed circuit board 10 with FPC 9b results when the surface of lands 9d of FPC 9b are caused to come into contact at right angles with respect to the surface of the printed circuit board 10, and the lands 9d and lands 10d are connected by solder bridges H, for example. The stresses placed upon stress concentration portion 9e are larger if the stroke of the slide cover 1 is made larger. That is, the deformation of FPC 9b increases in the direction in which the cover moves.

Referring now to FIGS. 12A, 12B, 13A, 13B, 14A, and 14B, depicted therein are other exemplary embodiments of strobe mounting board 9 and FPC 9b. Such FPCs are configured to suit particular spatial needs within electronic devices such as cameras, etc. Furthermore, in FIGS. 12A–14B, the views marked with an "A" depict a flattened or retracted FPC, and the views marked with a "B" depict a corresponding extended FPC.

With the strobe mounting board 9 shown in FIGS. 12A and 12B, FPC 9b has 3 straight portions 9b1, 9b3, 9b5, two bending portions 9b2, 9b4, and respective cut-out portions 9f1, 9f2 formed between the straight portion 9b1 and the straight portion 9b3, and between the straight portion 9b3 and the straight portion 9b5. In the case that the deformation of the straight portions 9b1, 9b3, 9b5 is the same as the deformation of the straight portions 9b1, 9b3 as shown in FIG. 3, the stroke of a camera slide cover unit can be extended by distance L2 in addition to that shown in FIG. 1 (corresponding to L1 of FIG. 10). Moreover, in the case that the stroke L of slide cover 1 is made equal, the magnitude of the torsion of bending portions 9b2, 9b4 can be smaller, and the durability of FPC 9b can be increased. Furthermore, in a closed state of slide cover 1, because the straight portions 9b1, 9b3, 9b5, and the bending portions 9b2, 9b4, are about in or in the same plane, the dimensions of the housing space (dimension in the direction of movement of the slide cover) can be kept down to about the same degree as the thickness of the FPC connection portion 9b.

Moreover, with the strobe mounting board shown in FIGS. 13A and 13B, FPC 9b has three straight portions 9b1, 9b3, 9b5 and two bending portions 9b2, 9b4. The shape of cut-out portion 9f3 differs from the case of FIGS. 12A and 12B, and the shape of FPC 9b is a rectangular/square spiral. An effect similar to that of FPC 9b of FIG. 10 can be obtained with this embodiment.

With the mounting boards described above with regard to FIGS. 9A, 9B, 12A, 12B, 13A and 13B, stress becomes concentrated at the stress concentration portions 9e of the bending portions 9b2, 9b4 of FPC 9b. Consequently, with the strobe mounting board 9 shown in FIGS. 14A and 14B, on the other hand, the shape of FPC 9b is a rounded spiral formed by smooth curves, and stresses are caused to distribute through the whole body forming FPC 9b when the same is caused to extend. Additionally, the cut-out portion 9f4 is formed in a rounded spiral shape. As such, reliability is increased in relation to breaks and the like. Moreover, FIG. 14A illustrates a case where a slide cover is closed such that FPC 9b becomes flattened and the space to accommodate it can be kept small. As shown in FIG. 12B extension and retraction of FPC 9b occur in directions which are perpendicular to a component/trace surface thereof.

Furthermore, the cut-out portions associated with the embodiments shown in FIGS. 9A, 9B, 12A, 12B, 13A and 13B, were formed between straight portions, but as shown in FIG. 15, for example, notch portions 9g1, 9g2 may also be formed without of gaps by instead cutting slits between straight portions 9b1, 9b3, 9b5. Moreover, in the embodiment shown in FIG. 15, for example, the shape of FPC 9b is a meandering or spiral form, but by making the cut-out shapes 9f5, 9f6 as shown in FIG. 16, the shape can be made more complex. In any case, with one end connected to the strobe mounting unit 9a dedicated to the strobe unit, and the other end connected to the main mounting or printed circuit board 10 within camera body 2, FPC 9b forms a single band-shaped connecting member with a shape in the plane of the board.

With the above-mentioned embodiments, examples have been described of connections between a main mounting board which is disposed in camera body 2 and strobe unit 7. The present invention is not so limited. To the contrary, the present invention can be applied to connect other structures within electronic devices.

The present invention provides certain benefits not heretofore realized by prior connecting apparatuses. In particular, by means of the present invention as described above and, in particular, because the present invention's flexible printed board deforms perpendicularly to the board surface when electrical components move, there is no torsion type bending as is case with folding flexible printed boards like those commonly found in the prior art. As a result, stresses realized when electronic components move relative to each other can be reduced, and the durability of such flexible printed boards can be increased.

Thus, having fully described the present invention by way of example with reference to the attached drawing figures, it will be readily appreciated that many changes and modifications may be made to the invention and to the embodiments shown and/or described herein without departing from the spirit or scope of the present invention which is defined in and covered by the appended claims.

What is claimed is:

1. An apparatus for coupling two electronic components that are configured to move relative to each other, comprising:

a flexible printed circuit board having a circuit disposed on a surface thereof, said flexible printed circuit board being flat and having at least one cut-out section, said at least one cut-out section dividing said flexible circuit board into at least two sections connected by at least one bending section, two of said at least two sections having a mounting member at the end opposite to said at least one bending section for coupling to one of said two electronic components, said at least two sections being deformable about said at least one bending section in a direction substantially perpendicular to said surface and in response to movement of said two electronic components when coupled to said two electronic components at said mounting members, said at least two sections extending and contracting in a direction transverse to a direction in which said flexible printed circuit board extends.

2. The apparatus according to claim 1, wherein said two electronic components are a a flash device and a corresponding control circuit within a camera.

3. The apparatus according to claim 1, wherein one of said two electronic components is mounted in a first camera body member and the other one of said two electronic components is mounted in a second camera body member, said flexible printed circuit board coupling said two electronic components.

4. The apparatus according to claim 1, wherein said at least two sections are straight sections.

5. The apparatus according to claim 1, wherein said flexible printed circuit board includes three straight sections, said at least one cut-out section being two cut-out sections, one of said cut-out sections separating a first section of said straight sections from a second section of said straight sections, a second of said cut-out section separating said second section of said straight sections from a third section of said straight sections, said three straight sections being parallel with each other, and said at least one bending section including a first bending section of connecting said first straight section to said second straight section and a second bending section connecting said third straight section to said second straight section 3.

6. The apparatus according to claim 4, wherein said straight sections include three straight sections and said at least one bending section includes two bending sections each connecting two of said three straight sections together.

7. The apparatus according to claim 1, wherein said flexible printed circuit board has a round shape and at least one cut-out section divides said circuit board into one spiral shaped bending section having a mounting member on each end of said bending section.

8. The apparatus according to claim 1, wherein said flexible printed circuit board has a rectangular shape.

9. The apparatus according to claim 1, wherein said mounting members are configured to couple said flexible printed board to a mounting member of one of said two electronic components.

10. The apparatus according to claim 1, wherein said at least one cut-out section is a slit.

11. The apparatus according to claim 1, wherein said two electronic components move in a direction substantially perpendicular to the plane of said flexible circuit board.

12. An apparatus for coupling two electronic components that are configured to move relative to each other, comprising:

a first end configured to be coupled to a first electronic component;

a flexible connecting member emanating from said first end, said connecting member including a flat component surface used to communicate electrical signals between said first electronic component and a second electronic component, said flexible connecting member having at least one bending section that permits said flexible connecting member to extend and retract in directions substantially perpendicular to said component surface, said at least one bending section permitting said flexible connecting member to be maintained in a single plane when in a fully retracted state; and a second end at which said connecting member terminate, said second end configured to be coupled to said second electronic component.

13. The apparatus according to claim 12, wherein said flexible connecting member is used to couple a flash device and a corresponding control circuit within a slide-type camera having at least two moveable camera body members.

14. The apparatus according to claim 12, wherein said first electronic component is mounted in a first camera body member and said second electronic component is mounted in a second camera body member.

15. The apparatus according to claim 12, wherein said flexible connecting member is a flexible printed circuit board.

16. The apparatus according to claim 12, wherein said flexible connecting member includes a plurality of straight sections and at least one open space defined between said plurality of straight sections, said at least one bending section member connecting said plurality of straight sections.

17. The apparatus according to claim 16, wherein said plurality of straight sections includes two straight sections.

18. The apparatus according to claim 16, wherein said plurality of straight sections includes three straight sections.

19. The apparatus according to claim 12, wherein said flexible connecting member has a round spiral shape.

20. The apparatus according to claim 12, wherein said flexible connecting member has a rectangular shape.

21. The apparatus according to claim 12, wherein said flexible connecting member further comprises a mounting end configured to connect to a mounting member of said first electronic component.

22. The apparatus according to claim 12, wherein said flexible connecting member includes a plurality of straight sections, at least one slit defined between said plurality of straight sections, and said at least one bending section connecting said plurality of straight sections.

* * * * *